United States Patent
Philipp

(10) Patent No.: US 6,993,607 B2
(45) Date of Patent: Jan. 31, 2006

(54) KEYBOARD WITH REDUCED KEYING AMBIGUITY

(76) Inventor: Harald Philipp, 651 Holiday Dr., Bldg. 5/300, Pittsburgh, PA (US) 15220

( * ) Notice: Subject to any disclaimer, the term of this patent is extended or adjusted under 35 U.S.C. 154(b) by 299 days.

(21) Appl. No.: 10/617,602

(22) Filed: Jul. 11, 2003

(65) Prior Publication Data

US 2004/0008129 A1 Jan. 15, 2004

Related U.S. Application Data

(60) Provisional application No. 60/395,368, filed on Jul. 12, 2002.

(51) Int. Cl.
- H03K 17/94 (2006.01)
- H03M 11/20 (2006.01)
- G06F 3/00 (2006.01)
- G06F 13/12 (2006.01)

(52) U.S. Cl. .............................. 710/67; 710/72; 341/33; 341/22

(58) Field of Classification Search ................... 710/62, 710/67, 72–73; 341/20, 22, 33, 26
See application file for complete search history.

(56) References Cited

U.S. PATENT DOCUMENTS

| | | | |
|---|---|---|---|
| 4,145,748 A | * 3/1979 | Eichelberger et al. | 341/33 |
| 4,420,744 A | * 12/1983 | Jesson | 341/25 |
| 4,617,554 A | 10/1986 | Krause et al. | |
| 4,954,823 A | 9/1990 | Binstead | |
| 5,469,159 A | 11/1995 | Fukazawa | 341/22 |
| 5,583,498 A | 12/1996 | Sukigara | 341/25 |
| 5,585,733 A | * 12/1996 | Paglione | 324/678 |
| 5,730,165 A | 3/1998 | Philipp | 137/1 |
| 5,844,506 A | 12/1998 | Binstead | 341/34 |
| 6,137,427 A | 10/2000 | Binstead | 341/33 |
| 6,452,514 B1 | 9/2002 | Philipp | 341/33 |
| 6,466,036 B1 | 10/2002 | Philipp | 324/678 |

FOREIGN PATENT DOCUMENTS

| | | |
|---|---|---|
| EP | 0 609 021 A | 8/1994 |
| EP | 0 689 122 A | 12/1995 |

* cited by examiner

Primary Examiner—Kim Huynh
(74) Attorney, Agent, or Firm—David Kiewit

(57) ABSTRACT

When an array of proximity sensors is used as a keyboard, it can provide an ambiguous output if a user's finger overlaps several keys or if liquid is spilled on the keyboard. This ambiguity is reduced by an iterative method that repeatedly measures a detected signal strength associated with each key, compares all the measured signal strengths to find a maximum, determines that the key having the maximum signal strength is the unique user-selected key and then suppresses or ignores signals from all other keys as long as the signal from the selected key remains above some nominal threshold value.

11 Claims, 4 Drawing Sheets

KEYBOARD WITH REDUCED KEYING AMBIGUITY

FIELD OF THE INVENTION

The invention relates to method and apparatus for controlling an array of touch or proximity sensors, and, more specifically for preventing accidental false inputs from keys adjacent to a selected key in a keyboard.

BACKGROUND INFORMATION

Arrays of capacitive proximity sensors are often used in keyboards, keypads and other touch-input apparatus. Two characteristics of capacitive sensors that lead to their use instead of conventional metallic switches are: 1) Capacitive sensors can be made in small sizes, which is desirable if a small, tightly packed keyboard is required; and 2) Capacitive sensors are particularly easy to environmentally seal, which is desirable if the keyboard is to be used in a wet environment or where there is a concern that contaminants may be spilled on the keyboard.

Conventional capacitive sensors, when tightly packed, or when used in the presence of conductive liquid films, suffer a keying ambiguity problem. In a small keyboard, for example, a user's finger is likely to overlap from a desired key to onto adjacent ones. This is especially problematic if the user has large fingers or if he or she presses on the keyboard surface hard enough to deform his or her finger. The same sort of effect is found when a conducting film is spilled on a keyboard, in which case the user's finger is sensed as though it were the size of the puddle. Problems of this sort are particularly acute in cash register keyboards used in food service establishments where beverage and food sauce spills are a frequent occurrence.

In his U.S. Pat. No. 5,730,165, the inventor teaches a capacitive field sensor employing a single coupling plate, which may be used as a key switch, and a method of detecting a change in capacitance of the coupling plate to ground. The apparatus taught in U.S. Pat. No. 5,730,165 comprises pulse circuitry for charging the coupling plate and for subsequently transferring the charge from the plate into a charge detector, which may be a sampling capacitor. The transferring operation is carried out by means of a transfer switch electrically connected between the coupling plate and the charge detector. One aspect of the teaching of that patent is the provision of apparatus for measuring a capacitance to ground of a plate, the apparatus comprising: a control means; a charging means connecting the plate to a voltage source supplying a first selected voltage; a discharging means responsive to a discharging output from the control means to connect the plate to a charge measurement capacitor that has a selected capacitance value and that has a first of its two terminals maintained at a second selected voltage, the second of the terminals supplying a voltage output representative of the capacitance to ground of the plate. From another viewpoint, U.S. Pat. No. 5,730,165 teaches a method of operating a capacitive sensor for sensing the presence of an object proximate a sensing plate by measuring a change in a capacitance to an electrical ground. This method comprises the steps of: a) setting an output of a charge detector comprising filter means to a first selected voltage; b) charging the plate from a voltage source to a second selected voltage; c) discharging, for a selected discharging interval, the plate into the charge detector; d) repeating steps b) through c); and e) reading an output of the charge detector as a representation of the capacitance of the plate. Yet another provision of U.S. Pat. No. 5,730,165 is a method of operating a capacitive sensor electrically connected between an electrical ground and a sensing plate disposed adjacent an external surface of a first object (e.g., a keyboard), the sensor measuring a capacitive change responsive to a second object (e.g., a user's finger) adjacent the first object, where the two objects are separately electrically coupled to the ground, the method comprising the steps of: a) charging the plate from a voltage source; b) connecting, for a discharging interval having a selected discharging duration, the plate to a charge detector having an output representative of the change of the capacitance to ground of the plate; and c) reading the output of the charge detector. The disclosure of U.S. Pat. No. 5,730,165 is herein incorporated by reference.

In his U.S. Pat. No. 6,466,036, the inventor teaches pulse circuitry for measuring capacitance to ground, the circuitry comprising a plurality of electrical switching elements, each of which has one side electrically connected to either a power supply voltage or to a circuit ground point. This circuit arrangement, which may be used with a keyboard as well as for many other applications, is more compatible with available integrated circuit design and manufacturing practices than is earlier pulse circuitry, which commonly had one side of at least one switching element floating. These improved arrangements provide superior performance at a lower manufacturing cost.

In his U.S. Pat. No. 6,466,036, the inventor describes apparatus for measuring the capacitance to ground of a plate. This apparatus comprises at least three switching elements, each of the at least three switching elements having both a respective open state and a single respective closed state, each of the at least three switching elements electrically connected to one of two distinct reference voltages; a sample capacitor having a proximal one of its two terminals connected to the plate by means not comprising one of the switching elements; a voltage measurement circuit connected to one of the terminals of the sample capacitor by means not comprising one of the switching elements, the measurement circuit comprising one of a logic gate and a voltage comparator. In this arrangement a first of the at least three switching elements connects the distal terminal of the sample capacitor to the first reference voltage when in its closed state and disconnects the distal terminal from the first reference voltage when in its open state. A second of the at least three switching elements connects the proximal terminal of the sample capacitor to the second reference voltage when in its closed state and disconnects the proximal terminal from the second reference voltage when in its open state. The third of the at least three switching elements connects the distal terminal of the sample capacitor to the second reference voltage when in its closed state and disconnects the distal terminal from the second reference voltage when in its open state. The apparatus further comprises a controller for operating the at least three switching elements so that at any time at least one of the at least three switching elements is in its respective open state. The disclosure of U.S. Pat. No. 6,466,036 is herein incorporated by reference.

In his U.S. Pat. No. 6,452,514, the inventor teaches several key switch arrays based on measuring changes in capacitive coupling between electrode pairs. In particular, he teaches a key matrix comprising a first plurality, N, of input lines, a second plurality, M, of output lines and N times M keys, wherein each key comprises a respective capacitive sensor for sensing the presence of an object proximate thereto and wherein each key is disposed adjacent a respective intersection of an input line and an output line. This key matrix characterized in that each of the keys comprises a respective driven plate connected to one of the N input lines and a respective receiving plate connected to one of the M output lines; each of the input lines is electrically connected to a respective signal generator for supplying a respective periodic plurality of voltage cycles to each of the driven plates connected to it. There is also a controller for controlling each of a plurality of switching elements in an arrangement in which it controls a first selected number of the plurality of switching elements so as to connect each of the receiving plates to a reference potential when that receiving plate is not connected to one of the two terminals of a charge integrator that can be selectively connected to at least one of the receiving plates during a selected portion of the respective voltage cycle supplied to the driven plate associated with the at least one of the receiving plates, the charge integrator directly connected to at least a first of the plurality of switching elements. There is also a measurement circuit for measuring a voltage on the charge integrator as an indication of the proximate presence of the object. The disclosure of U.S. Pat. No. 6,452,514 is incorporated herein by reference.

SUMMARY OF THE INVENTION

One aspect of the invention is that it provides an iterative method of removing keying ambiguity by repeatedly measuring a detected signal strength associated with each key in an array of keys having respective output signals responsive to a degree of coupling between the key and a user, comparing the measured signal strengths to find a maximum, determining that the key having the maximum signal strength is the unique user-selected key and suppressing or ignoring signals from all other keys as long as the signal from the selected key remains above some nominal threshold value. In this aspect, the array under consideration may be a keyboard or any convenient subset thereof.

Capacitive sensors, unlike bistable electromechanical switches which are either open or closed, provide a signal that varies with the degree of touch or extent or coupling between a user's finger and a sensing element of a keyboard. Other non-bistable touch sensors, such as an array of piezoelectric sensors in which the output from a given sensor increases with increasing activation force, share many of the properties of capacitive keys. Thus, much of the subsequent disclosure should be understood as being relevant to non-capacitive keys that also provide an output signal responsive to a degree of coupling between the key and a user's finger, stylus, or other actuation implement.

Another aspect of the invention is a non-bistable keyboard, such as a capacitive keyboard, in which each key has a respective detection integrator counter (DIC) associated with it. Each DIC is a clocked counter that counts up by one incremental value on each clock cycle during which a signal strength from the associated key is above some nominal threshold value, and that counts down by one value if the signal strength is less than the nominal value. A controller receives a respective input from each DIC and determines that one of the keys is active, or selected, when the detection integration (DI) count associated with that key exceeds a selected terminal count value, TC. When one of the keys is active, the controller controls all of the detection integrators associated with keys in a selected neighborhood of the active key to stop counting until the count associated with the active key falls below the selected terminal count value—i.e., until the key that had been active becomes inactive.

In another aspect of the invention, the signal from one key having a DI count close to TC is compared with the signals from other keys in a neighborhood, and if a signal from one of the other keys is greater than that from the one selected key during the time period before the one selected key is determined to be active, the selected key is cleared of its pending detection status, which may be done by clearing its DIC. On the other hand, if the signal from the one key is greater than that from one of the other keys in the neighborhood before the one key is determined to be in detection, the selected key is declared to be active and the other keys are cleared of their pending active conditions, if any. This may be done by clearing their DIC's.

In yet another aspect of the invention, if the signal strengths of two keys that are approaching a detection threshold value and that are both in a defined keyboard neighborhood both exceed the threshold value and their signal strengths are equal to each other (or are within a selected tolerance value) at the same time, an algorithm executed by a controller is used to declare one of the two keys to be active and the other to be inactive. It will be recognized that a wide variety of algorithms are possible and include, but are not limited to, a random, or pseudo-random selection of the active key, or a declaration of activity based on which key was scanned first.

The principle also applies in the minimal case where the DIC's terminal count (TC) is chosen to be equal to one. This is functionally the same as though there were no DIC, but rather just a simple signal comparison function with an inhibiting logic gate following it. Here, the inputs to the inhibiting gate also includes the logical comparisons of the signal strengths among the keys in the neighborhood.

Those skilled in the keyboard arts will understand that the above-mentioned neighborhoods can be defined in a wide variety of ways. In some cases, a neighborhood of a given key may consist of all the keys immediately adjacent the given key, or may comprise all the keys having no more than one key between them and the given key. In other cases, the neighborhood may comprise all the keys in a matrix array— e.g., in a keyboard for use in a numerical data entry application in which only one key is to be active at a time so that the sequence of input digits is uniquely determined. In other cases, such as in a typing or computer-input keyboard, the neighborhood of a key may comprise all other keys in the keyboard except for special purpose keys, such as a capitalization shift key, a control key, and the like. Moreover, some embodiments of the invention provide a keyboard that is configurable by a user who programs a controller to selectively consider or ignore various keys in an array.

Although it is believed that the foregoing rather broad recital of features and technical advantages may be of use to one who is skilled in the art and who wishes to learn how to practice the invention, it will be recognized that the foregoing recital is not intended to list all of the features and advantages. Those skilled in the art will appreciate that they may readily use both the underlying ideas and the specific embodiments disclosed herein as a basis for designing other arrangements for carrying out the same purposes of the present invention. Those skilled in the art will realize that such equivalent constructions are within the spirit and scope of the invention in its broadest form. Moreover, it may be noted that various embodiments of the invention may provide various combinations of the hereinbefore recited features and advantages of the invention, and that less than all of the recited features and advantages may be provided by some embodiments.

DETAILED DESCRIPTION

In studying this Detailed Description, the reader may be aided by noting definitions of certain words and phrases used throughout this patent document. Wherever those definitions are provided, the reader should understand that in many, if not most instances, such definitions apply to prior, as well as future uses of such defined words and phrases. At the outset of this Description, one may note: the terms "include" and "comprise," as well as derivatives thereof, mean inclusion without limitation; the term "or," is inclusive, meaning and/or; the term "non-bistable key" is used to describe a capacitive, piezoelectric, or other non-electro-mechanical device having an output signal responsive to an extent of coupling between a user and the key; the term "user" is most commonly used to designate that portion of the user, e.g., a finger, brought proximate a key in order to activate it, but "user" also includes any other handheld implement, such as a stylus, pen or the like, that a person could employ to actuate a key; the term "ON" describes the key actuated or selected key used to provide a unique key output from an array in which all other keys are "OFF"; and the term "decrement" describes any reduction in count value and specifically includes both reducing a count value by one and clearing the counter to contain a zero or null value.

Figure 1:
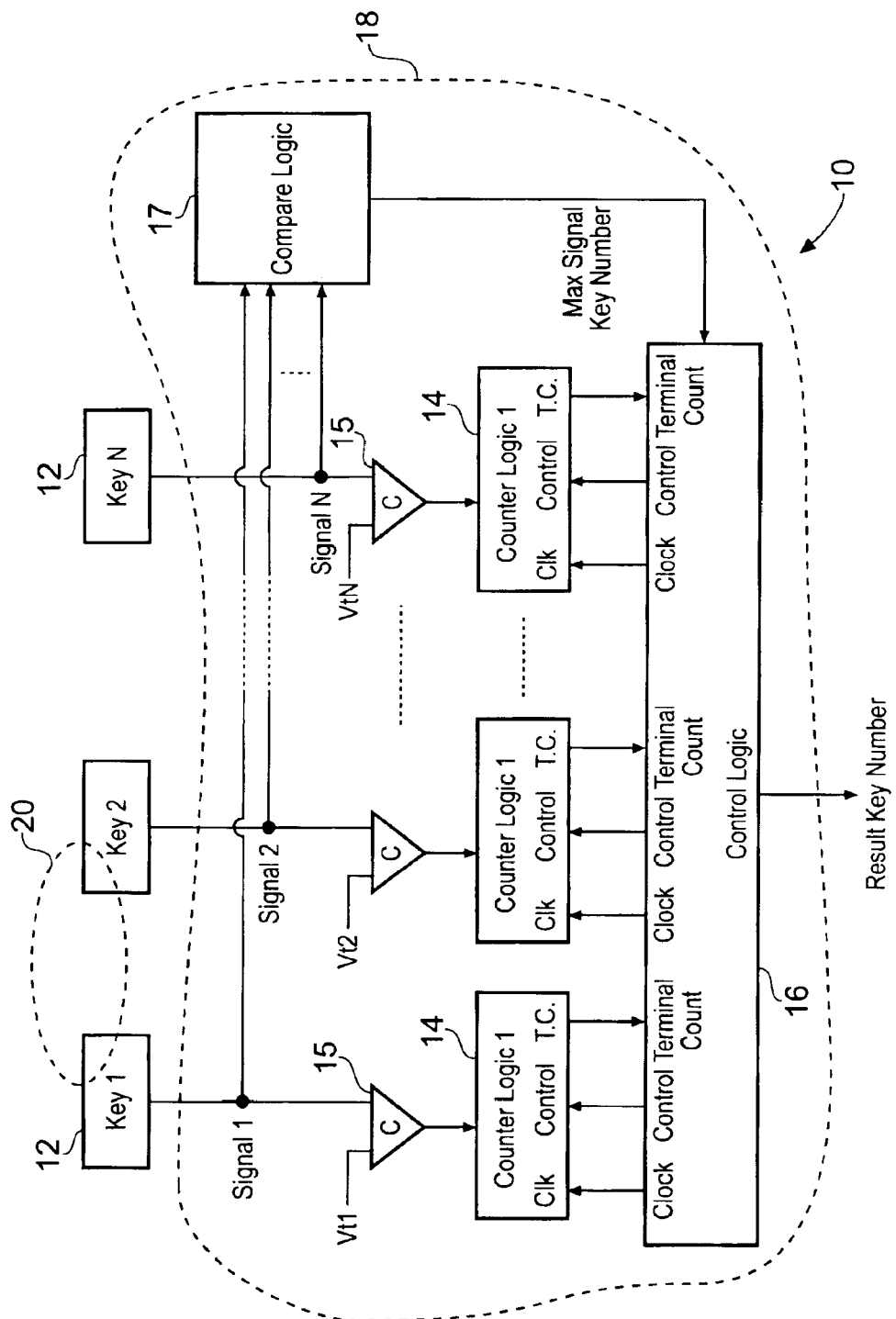
FIG. 1 is a schematic block diagram of apparatus of the invention.

Turning now to FIG. 1, one finds a schematic representation of apparatus of the invention 10, comprising an array of N sensors 12, which are preferably capacitive proximity sensors, and which are labeled "Key 1", . . . , "Key N". Each of the sensors 12 has respective output to both a respective counter 14 that supplies data to and is controlled by suitable control logic 16 and a respective output directly to the control logic. Those skilled in the electronic arts will appreciate that although the counters 14 and control logic 16 are depicted with discrete blocks in the schematic diagram, these features could be provided either by separate physical circuit elements, or could all be provided by a single microcontroller 18, as depicted by the dashed phantom line in FIG. 1. Moreover, although the array of keys 12 is depicted as being a simple linear array, it will be appreciated by one who reads the complete disclosure contained herein that many other sorts of arrays used as computer keyboards, keypads of the sort commonly used in telephony and automated banking, cash register data input keyboards, etc.

As discussed above, prior art capacitive keyboard arrays sense the proximate presence of a user's finger adjacent or abutting a single selected key. A problem arises, however, when the user touches more than one key, or when a conductive film bridges more than one key 12 so as to define an ambiquous touch area 20 as depicted by the single-dotted phantom curve in FIG. 1. The addition of counters 14, or of the logical functional equivalent thereof, when used in the accordance with the teaching of this disclosure, can remove or resolve such ambiguites by methods involving comparison of signal strengths from various keys 12.

Figure 2:
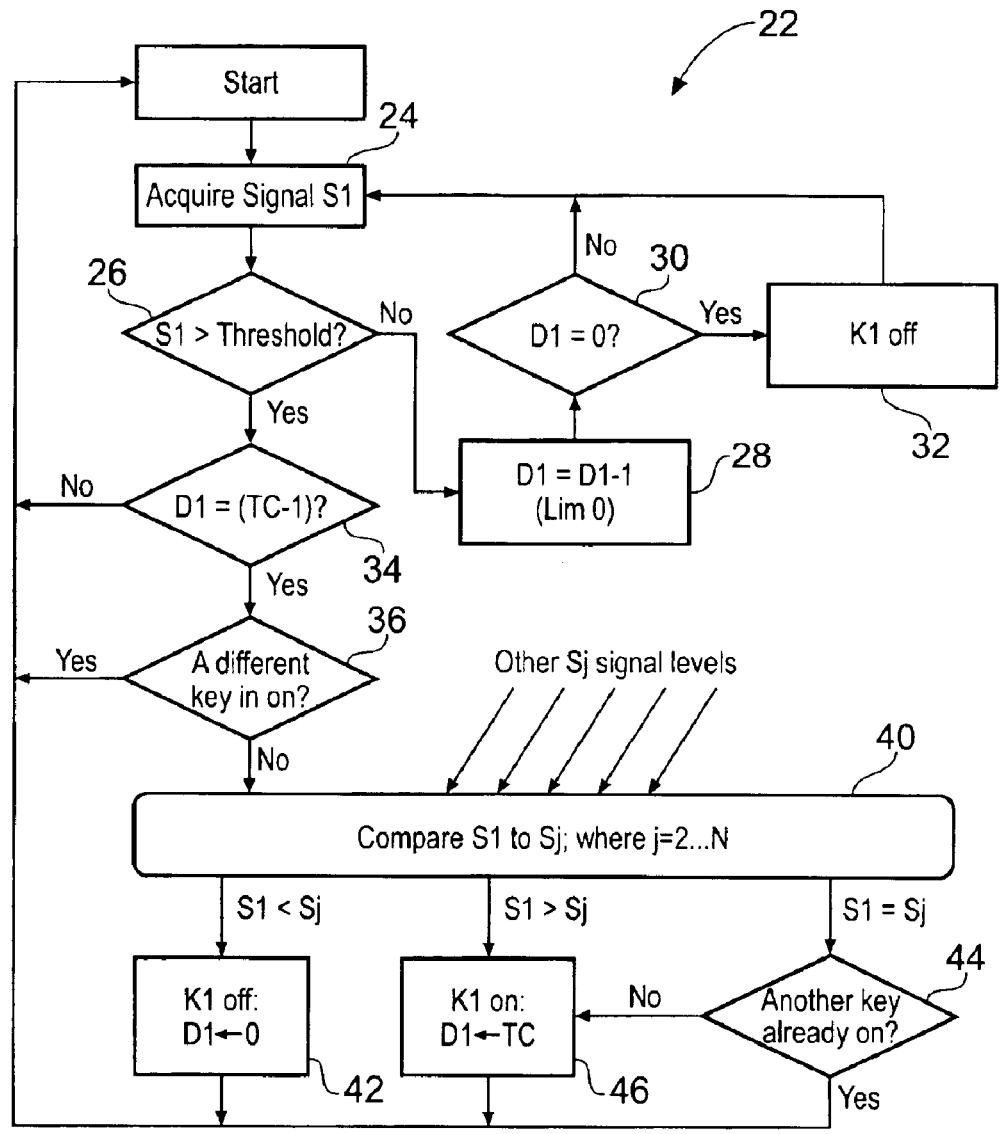
FIG. 2 is a flow chart showing logical operations carried out in a preferred method of the invention.

Turning now to FIG. 2, one finds a flow chart of a preferred method 22 of the invention for operating apparatus 10 to suppress extraneous key signals or to otherwise resolve keying ambiguities. This method 22 may be carried out by a microprocessor 18 operating under control of a program stored in a, preferably non-volatile, computer memory, or may be carried out by means of discrete circuit elements connected to provide hardwired logic. Although the chart of FIG. 2 depicts operation in terms of a single sensor 12, variously labeled "Key 1" or "K1", it will be understood that this simplification is solely in the interest of clarity of presentation and that an algorithm controlling an actual keyboard could carry out substantially the depicted method for each of the N keys in a parallel fashion.

The depicted method relies on iterated comparisons of sensor outputs, and selects a single sensor output based on that sensor both having an output in excess of a detection threshold for some selected number of counter cycles and thereafter having the highest output of all the sensors in the array that have also exceeded the detection threshold for the selected number of cycles of the counters. It will be recognized that one could choose to clock all the counters in parallel in order to achieve this, or that one could scan through the counters and operate them one at a time in rapid succession so as to provide the selected number of counter cycles for each sensor within a sufficiently short time period that a user could not perceive a delay in operation of the keyboard.

In a preferred method a signal S1, acquired from sensor key K1 (block 24) is compared with a selected signal threshold value (block 26). If S1 is less than the threshold value, the value, D1, in the DIC associated with K1 is decremented (block 28) if that value is greater than zero. The new value of D1 is then checked to see if it is zero (block 30), and, if so, K1 is determined to be OFF (block 32). In keyboards comprising a large number of keys, only one of which should be active at a time, this OFF status will, of course, be the predominant result of an analysis of the output of any given key.

In a preferred embodiment, if the signal S1 is above the signal threshold, the DIC value D1 is compared with a terminal count TC, as depicted in block 34, where the expression TC−1 is used to denote a count that is on the verge of triggering detection. If D1 is below the TC, D1 is incremented to a limit of TC and the acquisition 24 and signal threshold comparison 26 steps are repeated. If D1 is at the critical value TC, the program then determines if another key has been selected as the touched key in a previous iteration, i.e., is already ON (block 36). If so, the previous selection is confirmed, the output from K1 is ignored and the process is iterated until the output from the previously selected sensor falls below the threshold value, at which point the previously selected key is declared to be OFF. If, on the other hand, no other key is on, the output, S1, from K1 is compared with the output from all other keys in a neighborhood (block 40). If another key, Kj, has an output Sj greater than the output S1, then K1 is declared to OFF and its corresponding DIC is initialized by being reset to zero (block 42), thus forcing K1 to start the process all over again. If S1 is equal to the maximum value (Sj in the depiction of FIG. 2) of all the other keys, but Kj has already been declared ON (as depicted by block 44), then the counter D1 is in effect suspended at D1=(TC−1) and the cycle is repeated. If, however, signal S1 is greater than all Sj, then K1 is declared to be ON (block 46). Those skilled in the K1 is recognize that there are many other equivalent methods of operating a counter other than starting at zero and stepping up incrementally toward a terminal count and that counting methods include a wide variety of approaches of counting from some initialization value, described here as zero for clarity of presentation, towards some selected terminal value.

When K1 is declared ON, its associated DIC value, D1, is forced to equal the TC value (block 46) so as to prevent future comparison with other keys Kj in block 40 by forcing a loop back from block 34 to the START step on future iterations. This locks in the state of K1 for as long as it remains ON by virtue of its signal strength. Also, all other keys, Kj, are prevented from being declared ON because their process flows will never pass further than block 36. Once K1 is found to be OFF, the process of signal comparison in block 40 becomes available to all keys.

It should be noted that the case where TC=1 also works with the flow of FIG. 2. In this case, block 34 always passes logical flow to block 36 so long as no increment of the appropriate DIC has yet taken place. This is equivalent to the discrete logic flow shown in FIG. 3.

Figure 3:
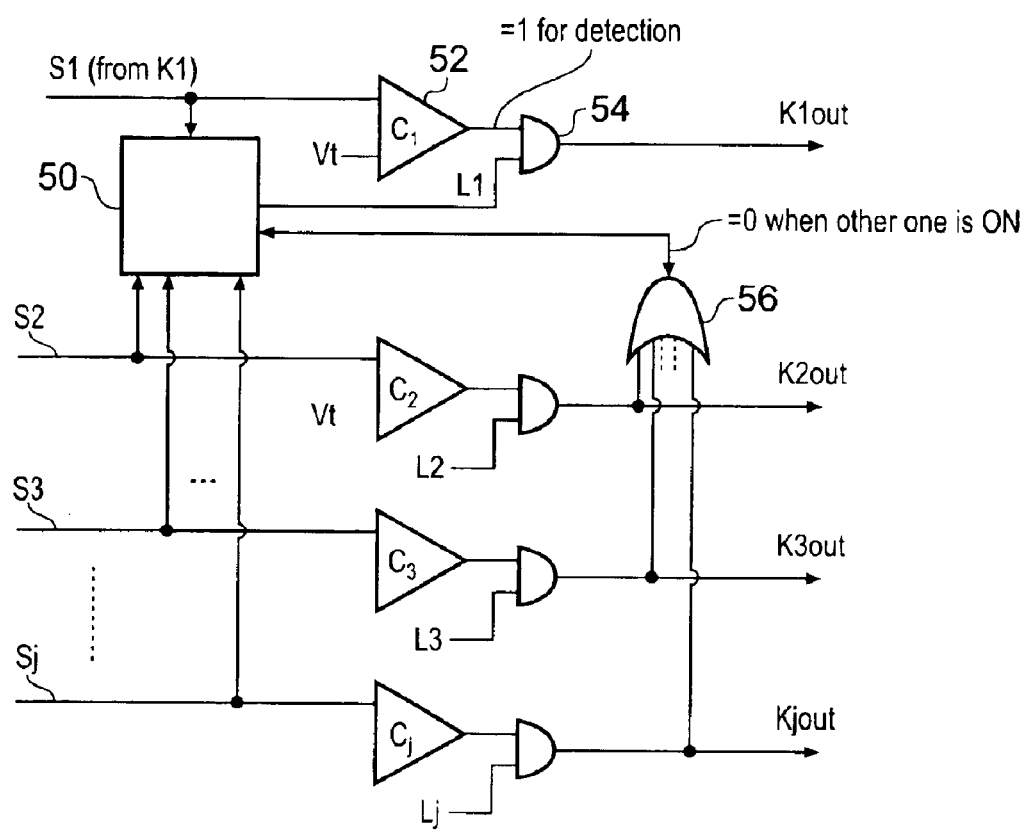
FIG. 3 is schematic circuit diagram of an apparatus of the invention using hardwired logic.

FIG. 3 shows a hardwired version using voltage comparators and logic gates, although it should be appreciated that the circuit is best implemented in fully digital form or in software. The following discussion is with respect to K1 but applies to the other Kj keys as well. Signal comparator 52 compares the signal S1 with a fixed threshold voltage Vt, which is set to determine the minimum signal permitted to allow S1 to be ON a logic block 50 and a gate 54 are used to inhibit the output of the comparator 52. The logic block 50 preferably contains additional voltage comparators 58 which compare S1 with the other signals Sj. A NOR gate 56 generates a logic low when any key, Kj, other than K1 has its output ON; this logic level is also fed to the logic block 50.

If a signal Sj is larger than S1, or any output Kj is ON, the AND gate 60 in logic block 50 will output a logic low to the input of D-type flip-flop 64, which is used to prevent race conditions, and which is clocked so as to sample the output of gate 60 at periodic intervals. The Q output, L1, of the flip-flop 64 is fed to a final gate 54, which is arranged to inhibit the output of comparator 52. Thus, the K1 output (K1out) will be inhibited if either another output Kj is already on, or if another signal Sj is higher than S1.

Figure 4:
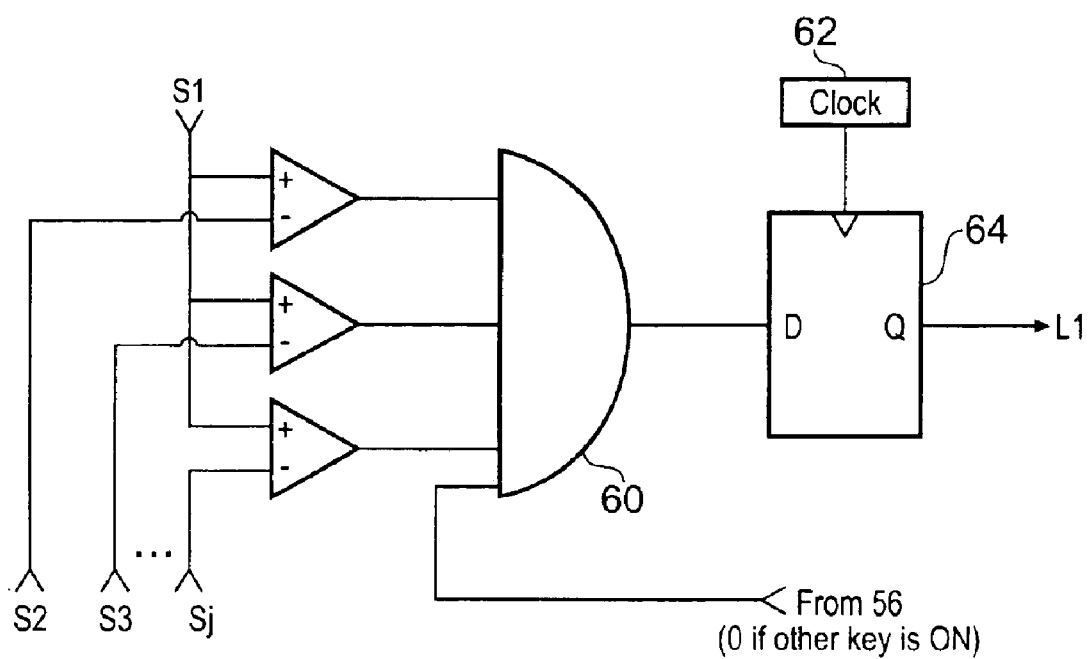
FIG. 4 is a schematic diagram of a logic block portion of the hardwired logic circuit of FIG. 3.

There are, of course, many possible variations and extensions of the procedure sketched out in FIGS. 2–4. For example, one may consider a rare case in which a user brings his or her finger up to a keyboard so that the point of touch is exactly between two keys. In this case, one could modify the depicted process to either select just one of those keys (e.g., by means of a known pseudo-random number selection algorithm) or by suppressing the output of both keys until the user move his or her finger enough that one of the two keys had a higher output than the other.

Those skilled in the art will appreciate that although the preferred embodiment employs an algorithm that counts up from zero, one could equally well use an algorithm that counted down from a selected large value. In this case, of course, resetting would involve resetting to the selected value rather than to zero, and the words 'increment' and 'decrement' in the preceding explanation would be interchanged.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

What is claimed is:

1. An iterative method for controlling an array of non-bistable keys to uniquely determine which one, if any, key of the array thereof has been is being touched by a user, wherein each of the keys provides a respective signal output representative of the a respective coupling of the user thereto, the method comprising the iterated steps of:

comparing the respective signals from all the keys and;

only if a previous iteration determined that the one of the keys had been touched by the user, comparing die respective signal from the previously touched one of the keys with a selected signal threshold value; and if the signal from the previously touched one of the keys exceeds the selected signal threshold value, confirming the previously touched one of the keys to be the key being touched and decrementing a respective counter value uniquely associated with each of the other keys and otherwise;

selecting the key having the highest signal output associated therewith and, if the highest signal output exceeds a the selected signal threshold value, incrementing the respective associated counter value, comparing the incremented counter value with a selected terminal count value and, if the incremented counter value exceeds the terminal count value, determining that the key having the highest signal associated therewith is the touched key being touched and decrementing the respective counter value uniquely associated with each of the other keys; and otherwise determining that no key has been is being touched by the user.

2. The method of claim 1 wherein a respective counter value is decremented by reducing it by one count subject to a condition that the value can not be reduced below zero.

3. The method of claim 1 wherein a respective counter value is decremented by setting it equal to zero.

4. The method of claim 1 wherein a respective counter value is decremented by setting it equal to a selected non-zero value.

5. The method of claim 1 wherein each key comprises a respective capacitive proximity sensor.

6. A keyboard for supplying a unique key output when a user is proximate two or more keys of a plurality thereof, the keyboard comprising:

a respective sensor uniquely associated with each of the two or more keys, each of the sensors connected to supply a respective output signal representative of the user's coupling thereto to both a controller and to a respective counter;

each counter arranged to count towards a terminal count when the respective proximity signal exceeds a selected signal threshold value and to supply the respective count value to the controller;

the controller for comparing arranged to compare all of the two or more output signals supplied thereto and to select as the key for supplying the unique key output that one of the two or more keys having a maximum of the count values used for supplying the unique key output.

7. The apparatus of claim 6 wherein the controller has an output to each of the counters for initializing a selected one of the counters.

8. The apparatus of claim 6 wherein a computer comprises the controller and all of the counters, the computer storing the signal threshold value and the terminal count value in memory.

9. The apparatus of claim 6 wherein each key comprises a respective capacitive proximity sensor.

10. In a keyboard comprising a plurality of touch responsive keys, wherein each of the keys has a respective signal output responsive to an extent of coupling to a user who touches the keyboard, an iterative method of determining a unique output, subsequent to the touch, the method comprising the steps of:

comparing the respective signal outputs from all the keys with each other and with a selected signal threshold value; and if a previously selected key has a respective signal output in excess of the signal threshold value, confirming the previous selection of the one of the keys to supply the unique output while suppressing signals from all other keys;

if no key was selected in a previous iteration and at least one of the keys has a respective signal output in excess of the signal threshold value, selecting that one of the at least one of the keys baying the highest signal output value to supply the unique output; and if no key has a respective signal output in excess of the signal threshold value, supplying a null output indicating that the user is no longer touching any of the keys.

11. The method of claim 10 wherein each of the keys comprises a respective capacitive proximity sensor.

\* \* \* \* \*

UNITED STATES PATENT AND TRADEMARK OFFICE
CERTIFICATE OF CORRECTION

PATENT NO. : 6,993,607 B2 Page 1 of 1
APPLICATION NO. : 10/617602
DATED : January 21, 2006
INVENTOR(S) : Philipp It is certified that error appears in the above-identified patent and that said Letters Patent is hereby corrected as shown below:

Column 8:

Line 4, delete "has been".

Line 6, after "representative of" delete "the".

Line 28, after "with is the" delete "touched".

Line 31, delete "has been".

Line 55, delete "for comparing".

Line 55, delete "for comparing".

Lines 59 & 60, delete "used for supplying the unique key output".

Column 10

Line 7, replace "baying" with - - having - - .

Signed and Sealed this

Fifth day of September, 2006

JON W. DUDAS
*Director of the United States Patent and Trademark Office*

UNITED STATES PATENT AND TRADEMARK OFFICE
CERTIFICATE OF CORRECTION

PATENT NO. : 6,993,607 B2
APPLICATION NO. : 10/617602
DATED : January 31, 2006
INVENTOR(S) : Philipp It is certified that error appears in the above-identified patent and that said Letters Patent is hereby corrected as shown below:

Column 8:

Line 4, delete "has been".

Line 6, after "representative of" delete "the".

Line 28, after "with is the" delete "touched".

Line 31, delete "has been".

Line 55, delete "for comparing".

Line 55, delete "for comparing".

Lines 59 & 60, delete "used for supplying the unique key output".

Column 10

Line 7, replace "baying" with - - having - - .

This certificate supersedes Certificate of Correction issued September 5, 2006.

Signed and Sealed this

Seventh day of November, 2006

JON W. DUDAS
*Director of the United States Patent and Trademark Office*